United States Patent
Mallikararjunaswamy (10) Patent No.: US 7,489,535 B2
(45) Date of Patent: Feb. 10, 2009

(54) CIRCUIT CONFIGURATIONS AND METHODS FOR MANUFACTURING FIVE-VOLT ONE TIME PROGRAMMABLE (OTP) MEMORY ARRAYS

(75) Inventor: Shekar Mallikararjunaswamy, San Jose, CA (US)

(73) Assignee: Alpha & Omega Semiconductor Ltd., Hamilton (BM)

( * ) Notice: Subject to any disclaimer, the term of this patent is extended or adjusted under 35 U.S.C. 154(b) by 22 days.

(21) Appl. No.: 11/588,736

(22) Filed: Oct. 28, 2006

(65) Prior Publication Data
US 2008/0112204 A1    May 15, 2008

(51) Int. Cl.
*G11C 17/00* (2006.01)
(52) U.S. Cl. ............. 365/96; 365/105; 365/230.06
(58) Field of Classification Search ............. 365/96, 365/225.7, 243, 230.06, 104, 105
See application file for complete search history.

(56) References Cited

U.S. PATENT DOCUMENTS

| | | | | |
|---|---|---|---|---|
| 3,442,206 A | * | 5/1969 | Sugimoto | 101/93.33 |
| 3,453,524 A | * | 7/1969 | Dinger | 363/135 |
| 3,694,669 A | * | 9/1972 | Witt et al. | 327/402 |
| 5,610,552 A | * | 3/1997 | Schlesinger et al. | 327/560 |
| 6,330,204 B1 | * | 12/2001 | Miyagi | 365/225.7 |

* cited by examiner

Primary Examiner—Gene N. Auduong
(74) Attorney, Agent, or Firm—Bo-In Lin (57) ABSTRACT

This invention discloses a circuit trimming system that includes a one-time programmable memory (OTP). The OTP further includes a forward biased trim device connected between a voltage supply Vcc and a ground voltage wherein the Vcc having a reduced voltage substantially lower than a trimming voltage for a reversed biased device at ten volts or higher. The OTP further includes a drive circuit provided to select the OTP at a low current operating condition and for turning on a high trim current through the forward biased trim device for trimming and programming the OTP. The trimming system further includes a sense circuit connected across the forward biased trim device is for sensing a current and voltage of the forward biased trim device.

23 Claims, 6 Drawing Sheets

CIRCUIT CONFIGURATIONS AND METHODS FOR MANUFACTURING FIVE-VOLT ONE TIME PROGRAMMABLE (OTP) MEMORY ARRAYS

BACKGROUND OF THE INVENTION

1. Field of the Invention

The invention relates generally to a circuit configuration and method of manufacturing programmable memory devices. More particularly, this invention relates to an improved circuit configuration and method for manufacturing a five-volt one-time programmable (OTP) memory cells.

2. Description of the Relevant Art

As more and more one-time programmable memory devices are employed for post packaging trimming operations, a person of ordinary skill in the art is still facing the challenge that a high voltage, i.e., a voltage greater than five volts, is required to program the OTP devices. This poses a potential device safety issue for low voltage devices operating at a voltage lower than the trimming voltage as higher trimming voltage may cause damage on those devices rated at a lower voltage. Furthermore, the production cost for the OTP is increased due to the requirement that extra masks are necessary to produce high voltage CMOS circuit. The high voltage circuit required for the OTP devices also causes the trim circuit to occupy greater die area on the silicon that also causes the increase in production costs.

There are increasing demands for precision power management products and circuits with reduction in power supply voltage and higher frequency of operation. Devices such as band-gap circuits and switched mode power supplies require output voltage or frequency with precise control and the precision requirements are becoming more stringent in modern power circuits. In the past, the precise control was obtained by using wafer level trim techniques such as metal/poly fuses and forward/reverse trimming of Zener diodes. However, under many circumstances, the wafer trim techniques are not sufficient to satisfy the precision requirements even after the chip is packaged due to the additional stress and charges induced by the packaging processes. Due to this reason, there is a need for post package trimming using one-time programmable devices.

Most prior art post package trim techniques use an NMOS-FET with a floating gate that is coupled to the control gate through a coupling capacitor implemented with a double poly stacked gate structure where the partial overlap of floating gate and control gate forms the coupling capacitor. The operational principle is to collect electrons in the floating gate and shift the threshold voltage of the NMOSFET. The electrons are collected using different techniques such as Fowler-Nordheim tunneling and HCI hot carrier injection. To improve the tunneling efficiency and lower the trimming voltage, different techniques are applied to enhance the electrical field in the carrier injection region. Such techniques include the implementation of a stacked gate structure where a portion of floating gate oxide is thinned to improve electron-collecting capability. However the removal of partial gate oxide requires extra etching step therefore increases the cost.

The One-time programmable (OTP) devices for post package trimming usually are processed at the same time as the functional circuit using standard CMOS technologies. For improving the hot-carrier degradation in the mainstream sub-micron CMOS technologies, a sidewall spacer with lightly doped drain (LDD) implant is used to reduce the drain to substrate field at the drain end of the channel. However, in order to increase the efficiency of electron injection into the floating gate of an NMOS, a higher drain field becomes necessary. A coupling PMOS transistor is then employed as a coupling a capacitor.

Figure 1A:
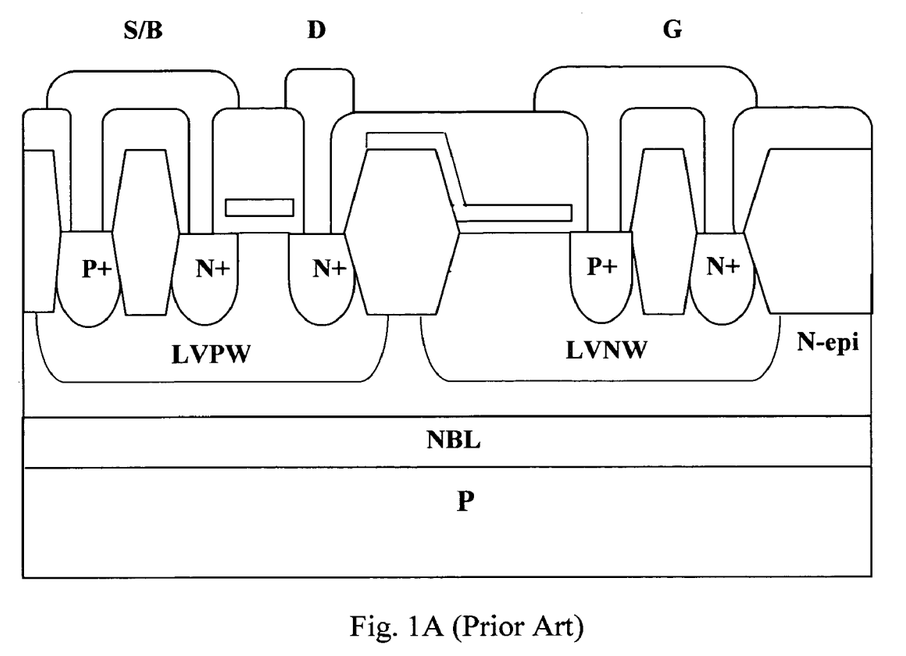
Figure 1B:
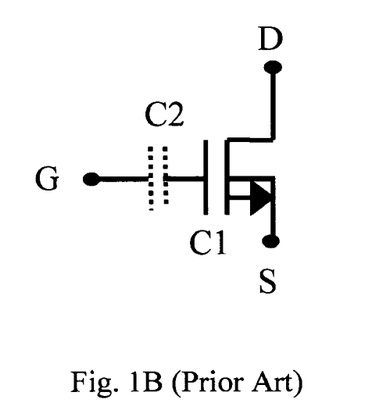
FIG. 1B is an equivalent circuit diagram and FIG. 1C is an I-V diagram of a conventional OTP memory applied for trimming operation.
Figure 1C:
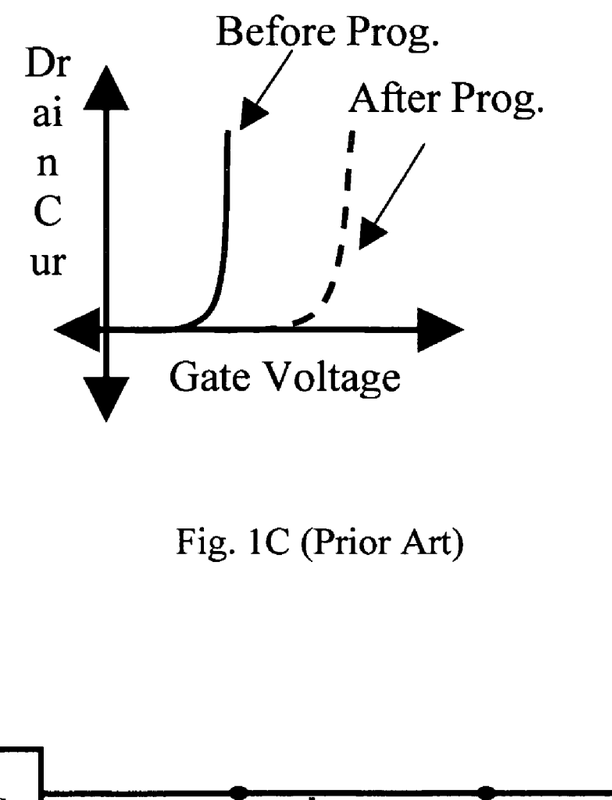

FIG. 1A is a cross sectional view for showing the NMOS transistor on the left that coupled to a PMOS transistor on the right functioning as a coupling capacitor. Referring to FIG. 1B for an equivalent circuit of the OTP device of FIG. 1A that can be implemented optionally with a double poly EPROM. FIG. 1C shows an I-V diagram for illustrating the program operation that shows the different I-V characteristics before and after an OTP program process. The programming voltage on the gate is typically 10 to 13 volts. For this reason, a high voltage (HV) circuit that can sustain such higher voltage ranges is required. Additionally, the OTP device further requires a high voltage electrostatic discharge (ESD), i.e., HV-ESD, protection circuit. In order to make the HV circuit, the NMOS requires additional N+ implant on the drain region to increase hot carriers. The OTP device further require a low programming current with a read voltage at approximately 1.5 volts, i.e., Vg=5V/Vd=1.5 V. A typical programming time is less than 100 μsec.

Figure 2A:
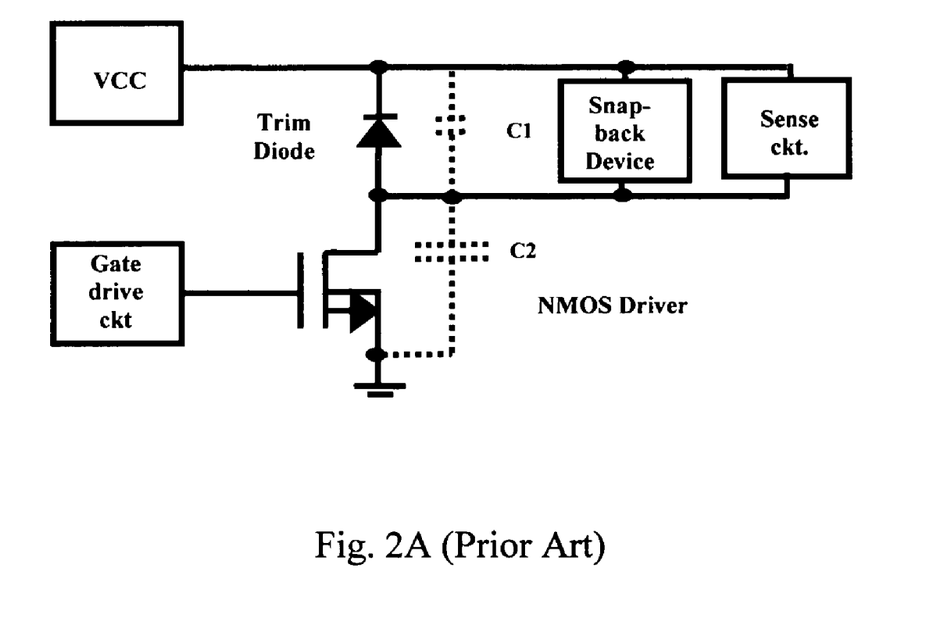
Figure 2B:
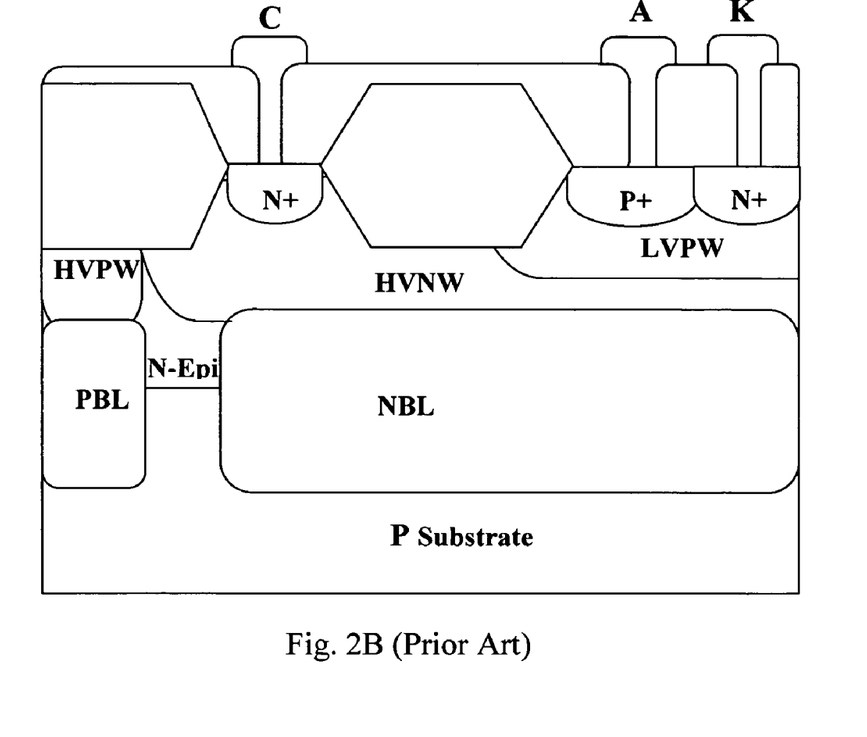
Figure 2C:
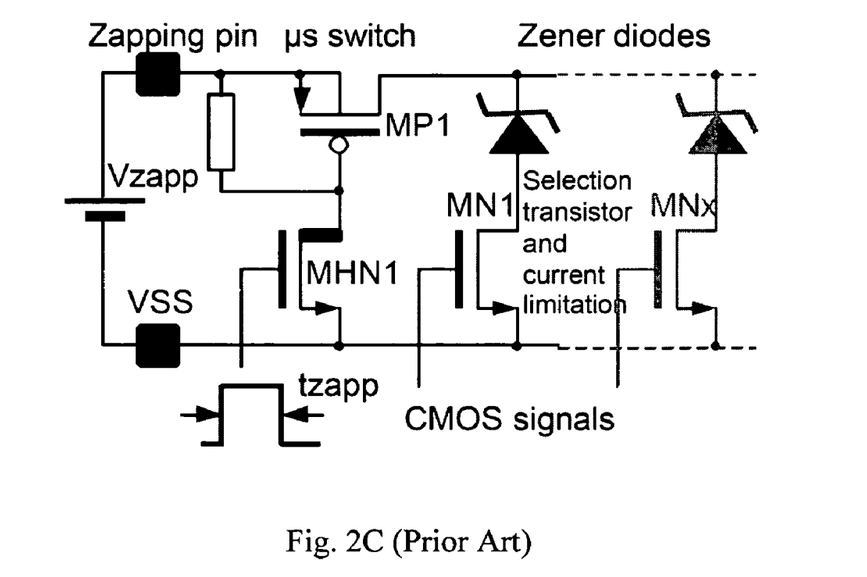
FIG. 2C is an equivalent circuit diagram of another conventional OTP memory applied for trimming operation.

Referring to FIG. 2A for a functional block diagram of a trimming system implemented with a conventional trim diode that employs a reverse bias diode to lower the trimming current as that shown in FIG. 2B with an equivalent circuit of OTP array shown in FIG. 2C. The programming voltage on the Vcc is typically 6-12 volts and therefore requires a high voltage configuration. As shown in FIGS. 2B and 2C, a high voltage NMOS, i.e., HV NMOS driver, is required to operate the trimming circuit thus requiring a large area for the trimming driver to sustain higher programming current in the range of 5 to 100 mA with typical programming time of one to ten μsec. Since the reverse bias diode is significantly smaller for easy trimming when comparing with the size of the NMOS due to the fact that the NMOS needs large channel width to support large trimming current, C1 is much smaller than C2 and an ESD spike would mostly applied to C1. In order to prevent false trimming operations caused by ESD events, a snap-back circuit across the trim diode is required which may in turn compete with the trim diode resulting the difficulty in making the device.

Another one-time programmable (OTP) memory is disclosed in another co-pending patent application Ser. No. 11/122,848 assigned to a common Assignee of this Application on May 5, 2005, the disclosures made in that Application is hereby incorporated by reference in this Application. A one-time programmable (OTP) memory cell is disclosed by taking advantage of the sidewall and corner breakdown features of a thin oxide layer overlying a polysilicon segment. The phenomena of etch undercut that occurs prior to a processing step of gate oxidation further degrades the breakdown property of the thin oxide. It is a common practice in the processes of manufacturing a integrate circuit (IC) device to take special care for preventing the development of the vulnerable points caused by the inter-poly breakdown due to the etch undercut phenomenon. Specifically, special attention is required in fabricating the conventional IC poly-poly capacitors or flash/EEPROM memory to prevent the breakdown vulnerability in these inter-poly coupling layers. Such special requirements may include an implementation of the high quality oxide-nitride-oxide composite layers as that commonly practiced in the electronic device manufacturing processes. Conversely, as disclosed in this invention, the weakness of the inter-poly sidewall oxide breakdown that commonly considered as an undesirable feature is utilized to realize an advantageous structural feature to more conveniently carry out an enhanced programming mechanism for the OTP cell. With a thin oxide layer covering an undercut corner to conveniently induce a breakdown, the conductivity between two polysilicon layers can be more conveniently generated. The poly segment sidewall configuration that commonly considered as undesirable structural feature is implemented for inducing a breakdown and for changing the conductivity state to perform the one-time program function. A high programmable voltage in the range of 15-20 volts is required. Therefore, a high voltage driver circuit preferably made of HV PMOS driver is required and the driver is also coupled with the HV selection NMOS circuits. The OTP can be operated with low programming current of approximately one mA with programming time of about one μsec. Manufacture of such OTP memory requires additional poly mask and the transfer of the manufacturing processes to other technologies depends on the inter-poly oxide layer thickness between two polysilicon layers and the breakdown voltage requirement.

Another one-time programmable (OTP) memory is disclosed in another co-pending patent application Ser. No. 11/518,001 filed by common Inventors of this Application on Sep. 7, 2006, the disclosures made in that Application is hereby incorporated by reference in this Application. A single poly one-time programmable (OTP) memory cell is disclosed that includes a first and second MOS transistor sharing the gate, drain and source region by applying a drift region implantation to delineate the first and second MOS transistors. The drift region implanted with a P-dopant is diffused into the channel regions from under the source and drain to counter dope a lightly dope drain region. The dopant profile of the drift region implanted is gradually decreased and ended at the boundary between the first and second MOS transistors thus creating a higher threshold voltage for the first MOS transistor with a higher level of dopant concentration and maintaining the same threshold voltage for the second MOS transistor functioning as a regular NMOS through the farther end of the first MOS transistor that has a decreased level of dopant concentration and LDD region. The OTP memory is connected to a coupling capacitor via the single polysilicon stripe. The coupling capacitor is implemented in a preferred embodiment as a PMOS complementary to the NMOS transistors of the OTP memory device in a common N-well. The P-drift region implanted for the OTP transistor is also simultaneously implanted as a source and drain for the coupling capacitor formed as a PMOS device. The programming voltage on the gate of the OTP is approximately 10-13 volts thus requiring HV trimming circuit and HV ESD protection circuits. The OTP memory can be operated with low programming currents and is programmed approximately less than 100 μsec. The manufacture processes require a high voltage P-drift mask and a transfer of such device into other technologies depends on the process in forming the HV P-drift regions in the technologies.

Therefore, a need still exists in the fields of circuit design and device manufactures for providing a new and improved circuit configuration and manufacturing method to provide the OTP memory with trimming circuits that can operate at approximately five volts. Specifically, a need still exists to provide new and improved OTP that can be trimmed at approximately five volts such that the standard 5-volts CMOS manufacturing processing technology can be applied without adding extra masks thus achieving cost savings and resolve the above discussed technical difficulties and limitations.

SUMMARY OF THE PRESENT INVENTION

It is therefore an aspect of the present invention to provide an improved circuit configuration and device structure for making an OTP memory by implementing forward biased diode as the trim element to reduce the programming voltage with the voltage supply Vcc to be less than six volts thus requiring five-volt rated devices such that the above discussed difficulties and limitations can be resolved.

It is another aspect of this invention that the OTP memory is trimmed with high trim current provided by a driving circuit operating in SCR mode that is triggered by a low current NMOS select transistor thus requiring only small area for the OTP memory. A high trimming current of about 200 mA is provided because the diode is trimmed in a forward biased mode the false trim due to the ESD is reduced as the current caused by ESD spike is not high enough to blow up the forward biased diode thus no ESD protection is required.

It is another aspect of this invention that the OTP memory is programmed at a high current provided by an N-MOS trigger SCR device, other low voltage high trimming current elements, such as metal fuse, poly fuse, Schottky diode, Zener diode and degenerate diode, may be incorporated as trim element to achieve low voltage operation.

It is another aspect of the present invention to provide an improved configuration and manufacturing processes for making an OTP memory by implementing N+ to P+ forward biased diode as the trim element to reduce the programming voltage with the voltage supply Vcc to be less than six volts thus requiring five-volt rated device. The manufacturing processes can be conveniently transferred to different process technologies because standard five-volt CMOS processes are implemented.

Briefly in a preferred embodiment this invention discloses a one time programmable (OTP) memory. The OTP memory includes a trim diode connected between a voltage supply Vcc and a ground voltage provided for trimming with a forward biased voltage. The OTP memory further includes a SCR-MOS drive circuit connected in series to the forward biased trim diode wherein the SCR-MOS drive circuit is provided to operate in a SCR mode with a high trim current and an integrated MOS transistor functioning as a select transistor at a lower current thus requiring a small area for a trimming circuit. In a preferred embodiment, the OTP memory further includes a sense circuit connected across the forward biased trim diode for sensing a current or voltage of the forward biased trim diode. In another preferred embodiment, the forward biased trim diode further includes a degenerate forward biased trim diode and the SCR-MOS transistor further includes a SCR-NMOS transistor. In another preferred embodiment, the SCR-MOS drive circuit is provided to turn on for snapping back a voltage and increasing a current transmitted through the forward biased trim diode for carrying out a trim operation on the forward biased trim diode. In another preferred embodiment, the OTP memory further includes a guard ring surrounding the forward biased trim diode and the SCR-MOS transistor for preventing a latch-up.

The present invention further discloses a method for carrying out a circuit trimming operation by implementing a one-time programmable memory (OTP). The method includes a step of connecting a forward biased device between a voltage supply Vcc and a ground voltage and setting the Vcc at a reduced voltage substantially lower than a trimming voltage for a reversed biased device at ten volts or higher. The method further includes a step of operating a drive circuit to select the OTP at a low current condition and turning on a high trim current through the forward biased trim device for trimming and programming the OTP. In an exemplary embodiment, the method further includes a step of connecting a sense circuit across the forward biased trim device for sensing a current and voltage of the forward biased trim device. In an exemplary embodiment, the step of connecting the forward biased trim device further includes a step of connecting a N to P forward biased trim diode; and step of connecting the drive circuit further includes a step of connecting a SCR-NMOS transistor. In another exemplary embodiment, the step of turning on the drive circuit further includes a step of turning on the drive circuit for snapping back a voltage and increasing a current transmitted through the forward biased trim device for carrying out a trim operation on the forward biased trim device. In another exemplary embodiment, the method further includes a step of preventing a latch-up by surrounding the forward biased trim device and the drive circuit by a guard ring. In another exemplary embodiment, the method further includes a step of supporting and integrating the forward biased trim device and the drive circuit for manufacturing as an integrated circuit (IC) on a semiconductor substrate. In another exemplary embodiment, the step of connecting to the voltage supply Vcc further includes a step of connecting to the voltage Vcc having a voltage six volts or less for trimming the forward biased trim device. In another exemplary embodiment, the step of connecting the forward biased trim device and the drive circuit further includes manufacturing and connecting the forward biased trim device and the drive circuit as five-volt rated devices whereby the OTP may be manufactured by standard five-volt device manufacturing processes.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIG. 1A is a cross sectional view.

FIG. 2A is a functional block diagram, FIG. 2B is a cross sectional view.

DETAILED DESCRIPTION OF THE METHOD

Figure 3A:
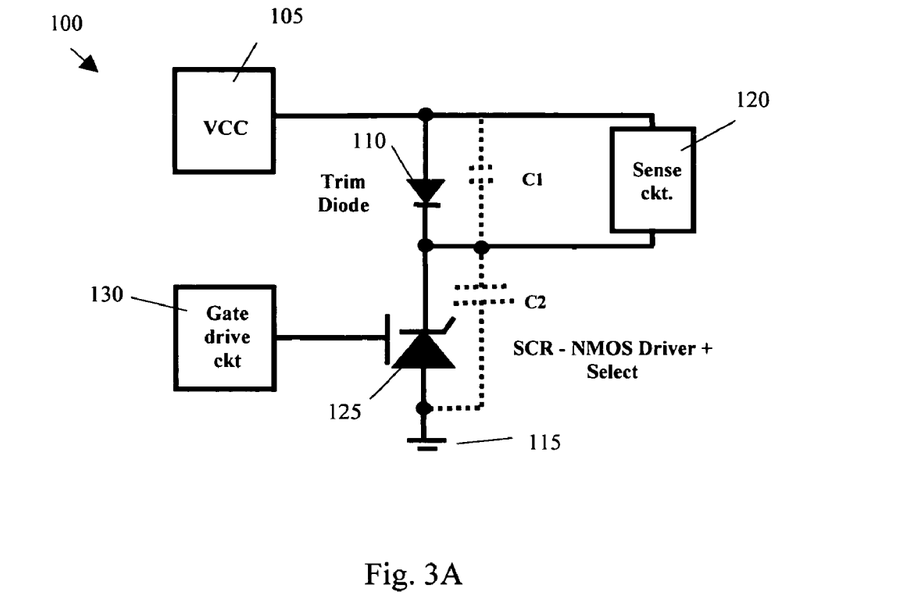
FIG. 3A is a functional block diagram and FIG. 3B is an I-V diagram of an one-time programmable (OTP) circuit of this invention for circuit trimming operation.
Figure 3B:
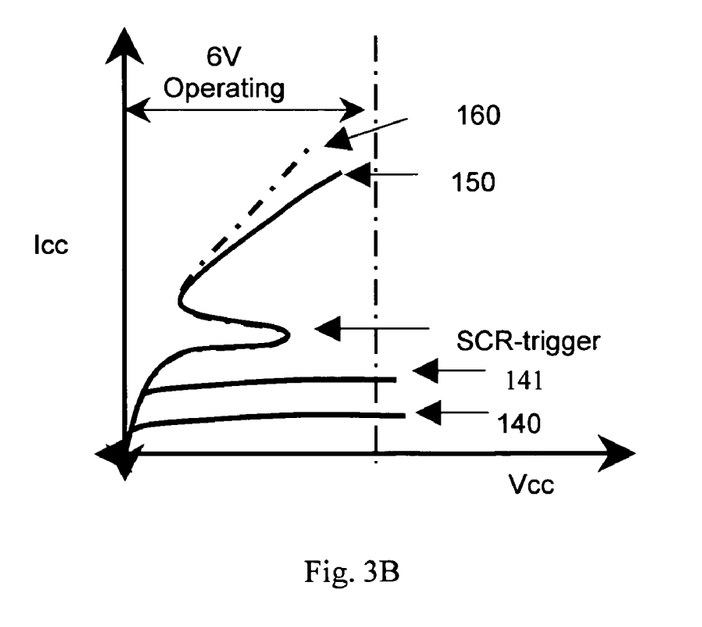

Referring to FIG. 3A for a system diagram of an OTP 100 of this invention for carrying out a trimming operation wherein the trim diode 110 is implemented as a forward biased diode to reduce the voltage drop over the diode. The trim diode 110 is operated between a voltage supply Vcc 105 and a ground voltage 115. Connected across the trim diode 110 is a sense circuit 120 for sensing the current and voltage of the trim diode. Additional circuits for circuit protection to prevent ESD false trim is no longer required because the diode is now forward bias and can absorb the ESD current without being trimmed or damaged. The trim circuit is connected in series to a SCR-NMOS drive circuit 125 with a gate connected to a gate driver 130 wherein the SCR-NMOS drive circuit 125 is a low voltage drive circuit and meanwhile providing a high trim current in the SCR mode. Furthermore, the NMOS transistor is functioning as a select transistor at a low current thus requiring smaller area for the trim circuit. FIG. 3B is an I-V diagram showing the current versus voltage variations across the OTP. When the gate drive circuit supplies a low gate voltage to the gate of 125, the SCR-NMOS circuit operates in MOSFET mode therefore current is limited by the saturation current corresponding to the gate voltage as curves 140 and 141. The SCR will not be turned on. As the gate voltage increases, the saturation current also increases and that turns on the SCR thus causing the voltage to snap back and leads to a rapid current increase as shown by I-V curve 150. In carrying out a trimming operation, the voltage supply Vcc is ramped up to about five volts. A gate voltage higher than the gate voltage required for SCR trigger is applied to the selected SCR-NMOS gate to trim the selected OTP cell. A large SCR current flows through the diode 110 for trimming the diode and the current is increased even more as shown in the dotted line 160 when compared to the solid I-V curve 150 before a trim operation is completed. This is because the diode becomes short after trim and the original voltage drop across the diode before trim now adds on to the SCR-MOS therefore drive the current even higher. Once the OTP is trimmed, the Vcc is ramped down to turn off SCR action and then ramped up again to detect the trimming status of diode 110. With the gate voltage set from zero volt to any voltage lower than gate voltage required for SCR triggering, the reading process may be carried out by monitoring the diode voltage before and after a trimming operation or by comparing the trimmed diode verses an un-trim diode. Other sensing methods such as current sensing may also be implemented. Furthermore, a very high trimming current is now provided with the implementation of the SCR-NMOS circuit. Therefore, other elements such as anti-fuse, poly fuse, metal fuse, Schottky diode or Zener diode may be used to replace degenerate diode 110. The sequence of the trimming element and the SCR-NMOS drive circuit may be switched with the driving circuit connected to Vcc and the trimming element connected to ground. The trim element may be short or open circuit after trimming depending on the type of element used.

Figure 4A:
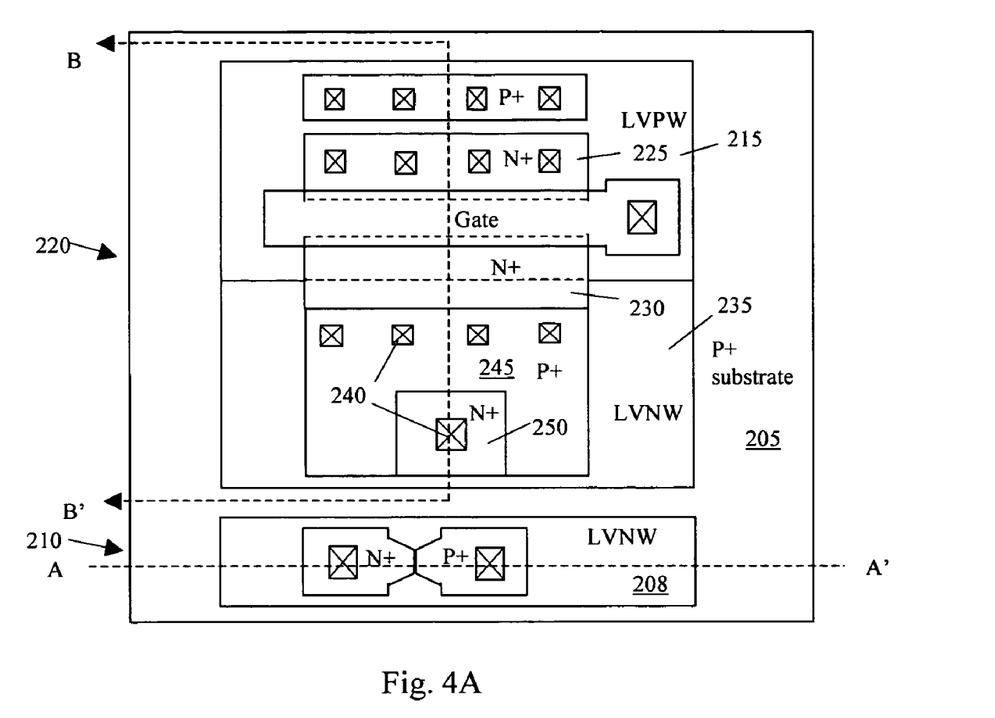
FIG. 4A is a top view and FIGS. 4B and 4C are cross sectional view of a device implementation of OTP circuit of this invention.
Figure 4B:
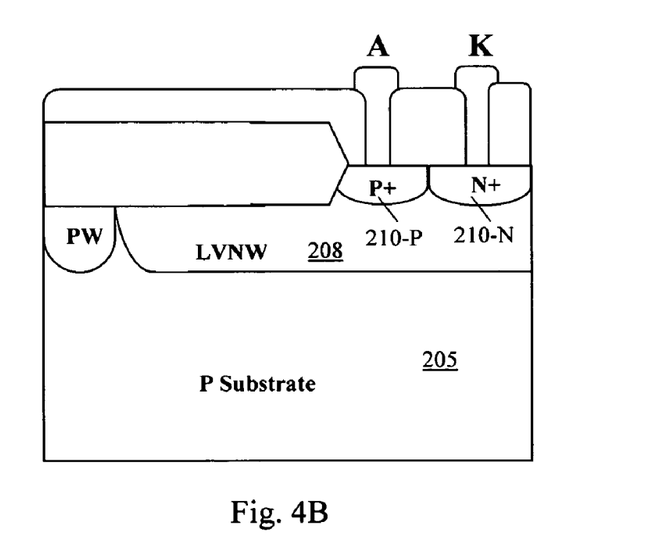
Figure 4C:
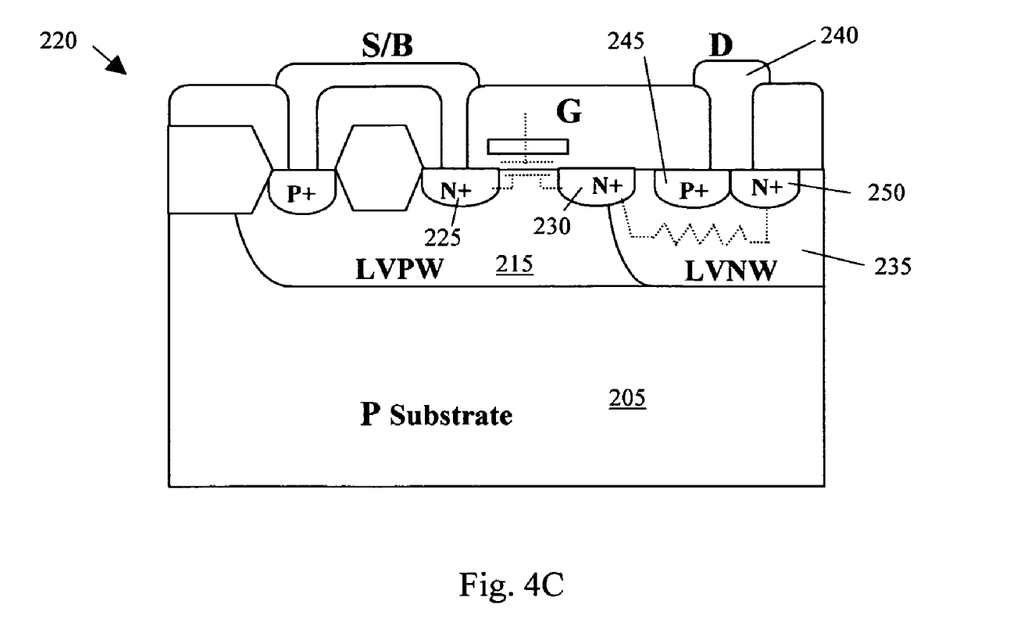

Referring to FIG. 4A for a top view and FIGS. 4B and 4C for cross sectional views across sections A-A' and B-B' on FIG. 4A of an exemplary device according to an OTP circuit of this invention. The OTP device is supported on a P-substrate 205 wherein a N+/P+ degenerate diode 210 is shown on the bottom portion of the device layout. The N+/P+ degenerate diode 210 is formed in a low voltage N-well (LVNW) 208 with a N+ region 210-N and P+ region 210-P formed in the LVNW 208 connected to a cathode 210-K and an anode 210-A respectively. FIG. 4B shows a cross sectional view of the N+/P+ degenerate diode 210. A NMOS triggered SCR structure 220 is shown on the upper portion of the device layout with a cross sectional view shown in FIG. 4C. A low voltage P well (LVPW) 215 is formed over the substrate 205 wherein two N+ regions form the source 225 and drain 230 of a NMOS. The N+ drain region 230 extends into a low voltage N well (LVNW) 235 formed next to the LVPW 215 to connect to a drain electrode 240 through the LVNW 235. a N+ region 250 is provided to improve the ohmic contact between the LVNW 235 and electrode 240. A P+ region 245 is disposed in LVNW 235 next to N+ region 250. The P+ region 245 in LVNW 235, the LVNW 235, the LVPW 215 and the N+ source region 225 form a PNPN SCR device. In low current, the P+ region 245 is shorted to the LVNW 235 through the drain electrode 240 and the N+ regions 250 connecting the LVNW 235 to the drain electrode 240. When the current increases, the lateral distance between the two N+ regions 230 and 250 inside the LVNW 235 provides a distributed resistance causing the voltage on LVNW to drop. When the voltage difference between P+ region 245 and the LVNW 235 reaches about 0.7 volts the PNPN SCR is triggered on and the current will greatly increase. By adjusting the length of P+ region 245 and the resistivity of LVNW 235, the PNPN SCR trigger voltage can be precisely controlled. To prevent bit to bit latch up, guard rings (not shown) can be formed around the periphery of each OTP cell. This is well known in the art.

Figure 5:
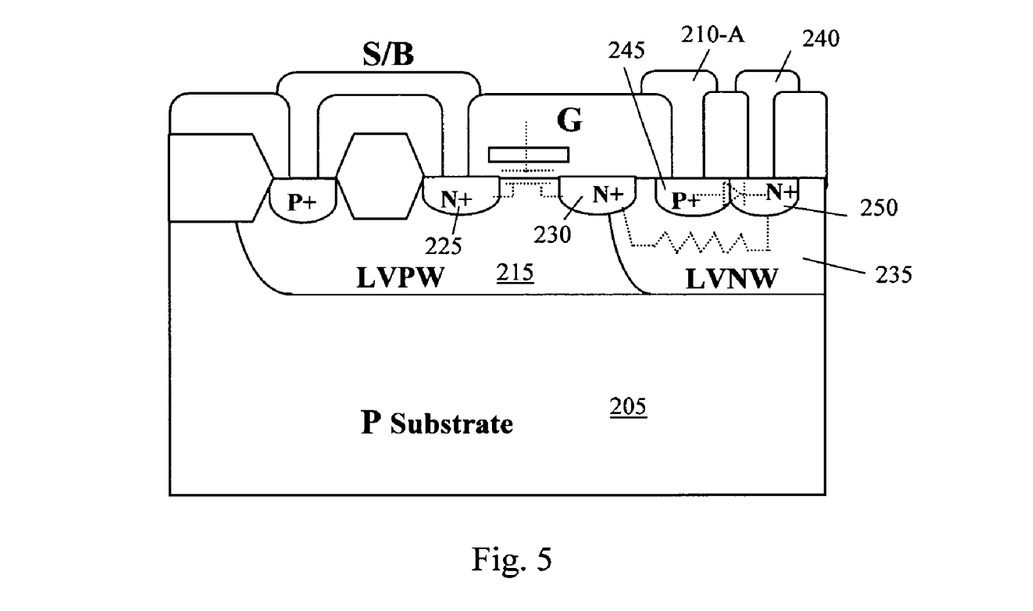
FIG. 5 is a cross sectional view of another device implementation of OTP circuit of this invention.

Refer to FIG. 5 for the cross sectional view of another exemplary device according to an OTP circuit of this invention wherein the degenerate diode is fully integrated with the SCR device. As shown in FIG. 5 the P+ region 245, the LVNW 235, the LVPW 215 and the N+ source region 225 form a PNPN SCR device. Further, the P+ region 245 and N+ region 250 constitute a degenerate diode 110. The operation principle is similar to the embodiment of FIGS. 4A-4C.

According to above descriptions and drawings, this invention discloses a circuit trimming system that includes a one-time programmable memory (OTP). The OTP further includes a forward biased trim device connected between a voltage supply Vcc and a ground voltage wherein said Vcc having a reduced voltage substantially lower than a trimming voltage for a reversed biased device at ten volts or higher. The OTP further includes a drive circuit provided to select said OTP at a low current operating condition and for turning on a high trim current through said forward biased trim device for trimming and programming said OTP. In an exemplary embodiment, the trimming system further includes a sense circuit connected across said forward biased trim device for sensing a current or voltage of said forward biased trim device. In another exemplary embodiment, the forward biased trim device further includes a N to P forward biased trim diode and the drive circuit further includes a SCR-NMOS transistor. In another exemplary embodiment, the drive circuit is provided to turn on for snapping back a voltage and increasing a current transmitted through the forward biased trim device for carrying out a trim operation on the forward biased trim device. In another exemplary embodiment, the OTP further includes a guard ring surrounding the forward biased trim device and the drive circuit for preventing a latch-up. In another exemplary embodiment, the trimming system further includes a semiconductor substrate for supporting and integrating the forward biased trim device and the drive circuit as an integrated circuit (IC) manufactured thereon. In another exemplary embodiment, the voltage supply Vcc having a voltage substantially around six volts for trimming the forward biased trim device. In another exemplary embodiment, the forward biased trim device and the drive circuit further constituting five-volt rated devices whereby the OTP may be manufactured by standard five-volt device manufacturing processes. In another exemplary embodiment, the OTP further includes a P type semiconductor substrate for supporting a low voltage N-well (LVNW) for encompassing the N to P forward biased trim diode therein and the P type semiconductor substrate further includes a low voltage P-well (LVPW) opposite the LVNW on the P type semiconductor substrate and encompassing a N-source and a N-drain of a lateral MOS transistor. The OTP further has another LVNW disposed next to the LVPW to encompass part of the N-drain and a N region and a P region therein thus constituting a PNPN SCR device integrated with the lateral MOS device.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

I claim:

1. A one-time programmable memory comprising:
    a trim element comprising a forward-biased trim diode connected between a voltage supply Vcc and a ground voltage;
    a SCR drive circuit connected in series to said trim element wherein said SCR drive circuit provides a trimming current to trim said trim element;
    a P-type semiconductor substrate for supporting and integrating said forward biased trim diode and a SCR-MOS transistor functioning as said SCR drive circuit as an integrated circuit (IC) manufactured thereon;
    said SCR-MOS transistor is further disposed on said P type semiconductor substrate for supporting a low voltage P-well (LVPW) encompassing a N-source and a N-drain of a lateral MOS transistor and a low voltage N-well (LVNW) disposed next to said LVPW to encompass part of said N-drain and a N+ region and a P+ region therein thus constituting a PNPN SCR device integrated with said lateral MOS device; and
    said N+ region and P+ region encompassed within said LVNW forming a forward biased diode.

2. The one-time programmable memory of claim 1 wherein:
    said SCR-MOS transistor functioning as said drive circuit connected in series to said trim element wherein said SCR-MOS transistor is provided to function as a select transistor.

3. The one-time programmable memory of claim 1 wherein:
    said N+ region and P+ region encompassed within said LVNW forming a forward biased diode are disposed immediately next to each other.

4. The one-time programmable memory of claim 1 further comprising:
    a sense circuit connected across said trim element is for sensing a current or voltage of said trim element.

5. The one-time programmable memory of claim 1 wherein:
    said SCR-MOS transistor further comprising a SCR-NMOS transistor.

6. The one-time programmable memory of claim 1 wherein:
    said SCR-MOS transistor constituting said drive circuit is provided to turn on for snapping back a voltage and increasing a current transmitted through said trim element for carrying out a trim operation on said trim element.

7. The one-time programmable memory of claim 1 wherein:
    said voltage supply Vcc having a voltage substantially six volts or higher for trimming said trim element.

8. The one-time programmable memory of claim 1 wherein:
    said forward biased trim diode and said SCR-MOS transistor constituting said drive circuit further constituting five-volt rated devices whereby said OTP may be manufactured by standard five-volt device manufacturing processes.

9. A circuit of one-time programmable memory (OTP) trimming system comprising:
    a trim device comprising a forward-biased trim diode connected between a voltage supply Vcc and a ground voltage;

a SCR drive circuit connected in series to said trim device for providing a high trim current through said trim device for trimming and programming said OTP;

a P-type semiconductor substrate for supporting and integrating said forward biased trim diode and a SCR-MOS transistor functioning as said SCR drive circuit as an integrated circuit (IC) manufactured thereon;

said SCR-MOS transistor is further disposed on said P type semiconductor substrate for supporting a low voltage P-well (LVPW) encompassing a N-source and a N-drain of a lateral MOS transistor and a low voltage N-well (LVNW) disposed next to said LVPW to encompass part of said N-drain and a N+ region and a P+ region therein thus constituting a PNPN SCR device integrated with said lateral MOS device; and said N+ region and P+ region encompassed within said LVNW forming a forward biased diode.

10. The circuit trimming system of claim 9 further comprising:

said SCR-MOS transistor functioning as said drive circuit connected in series to said trim device with a MOS gate connected to a gate drive circuit whereby said SCR-MOS transistor functions as a select transistor.

11. The circuit trimming system of claim 9 further comprising:

said N+ region and P+ region encompassed within said LVNW forming a forward biased diode are disposed immediately next to each other.

12. The circuit trimming system of claim 9 further comprising:

a sense circuit connected across said trim device for sensing a current or voltage of said forward-biased trim diode functioning as said trim device.

13. The circuit trimming system of claim 9 wherein:

said SCR-MOS transistor further comprising a SCR-NMOS transistor.

14. The circuit trimming system of claim 9 wherein:

said SCR-MOS transistor constituting said drive circuit further comprising a SCR-PMOS transistor.

15. The circuit trimming system of claim 14 wherein:

said SCR-MOS transistor constituting said drive circuit is provided to turn on for snapping back a voltage and increasing a current transmitted through said trim element for carrying out a trim operation on said trim element.

16. The circuit trimming system of claim 9 wherein:

said voltage supply Vcc having a voltage substantially six volts or higher for trimming said trim device.

17. A method for carrying out a one-lime programmable memory (OTP) comprising:

connecting a trim device between a voltage supply Vcc and a ground voltage; and operating a drive circuit in SCR mode for providing a high trim current through said trim device for trimming and programming said OTP by forming said drive circuit as a SCR-MOS transistor on a P-type substrate with a low voltage N-well (LVNW) disposed next to said LVPW to encompass part of said N-drain, a P+ region and a N+ region connecting to a drain electrode, wherein said P+ region, said LVNW, said LVPW and said N+ source constituting a PNPN SCR device integrated with a lateral MOS device; and encompassing said N+ region and P+ region within said LVNW for forming a forward biased diode to function as a trim element. providing integrated with said lateral MOS device.

18. The method of claim 17 further comprising:

operating said SCR-MOS transistor functioning as said a drive circuit in MOS mode to trigger said SCR-MOS transistor to select said OTP.

19. The method of claim 17 further comprising:

connecting a sense circuit across said trim device for sensing a current or voltage of said forward-biased trim diode functioning as said trim device.

20. The method of claim 17 wherein:

said step of connecting said trim device further comprising a step of connecting said forward biased trim device between a voltage supply Vcc and a ground voltage and setting said Vcc at a reduced voltage substantially lower than a trimming voltage required for a reversed biased device.

21. The method of claim 17 wherein:

said step of turning on said SCR-MOS transistor functioning as said drive circuit drive circuit further comprising a step of turning on said drive circuit for snapping back a voltage and increasing a current transmitted through said forward biased trim device for carrying out a trim operation on said forward biased trim device.

22. The method of claim 17 further comprising:

adjusting a N doping level in said LVNW and a lateral distance between said N+ drain and said N+ region connecting to said drain electrode to control a threshold current level for setting on said PNPN SCR device.

23. The method of claim 17 wherein:

said step of connecting said forward biased trim device and said drive circuit further comprising manufacturing and connecting said forward biased trim device and said drive circuit as five-volt rated devices whereby said OTP may be manufactured by standard five-volt device manufacturing processes.

\* \* \* \* \*